(12) United States Patent
Cheng

(10) Patent No.: US 9,379,300 B2
(45) Date of Patent: Jun. 28, 2016

(54) FLOATING HEAT SINK SUPPORT WITH COPPER SHEETS AND LED PACKAGE ASSEMBLY FOR LED FLIP CHIP PACKAGE

(71) Applicant: Yung Pun Cheng, Hong Kong (CN)

(72) Inventor: Yung Pun Cheng, Hong Kong (CN)

( * ) Notice: Subject to any disclaimer, the term of this patent is extended or adjusted under 35 U.S.C. 154(b) by 0 days.

(21) Appl. No.: 14/438,072

(22) PCT Filed: Aug. 7, 2014

(86) PCT No.: PCT/CN2014/083856
§ 371 (c)(1),
(2) Date: Apr. 23, 2015

(87) PCT Pub. No.: WO2015/032256
PCT Pub. Date: Mar. 12, 2015

(65) Prior Publication Data
US 2015/0280092 A1    Oct. 1, 2015

(30) Foreign Application Priority Data

Sep. 6, 2013  (CN) ...................... 2013 2 0552457 U

(51) Int. Cl.
*H01L 33/00*        (2010.01)
*H01L 33/64*        (2010.01)
(52) U.S. Cl.
CPC ............. *H01L 33/642* (2013.01); *H01L 33/641* (2013.01); *H01L 33/64* (2013.01); *H01L 33/647* (2013.01)
(58) Field of Classification Search
CPC ............................... H01L 33/64; H01L 33/642
See application file for complete search history.

(56) References Cited

U.S. PATENT DOCUMENTS

2013/0320390 A1* 12/2013 Palaniswamy .......... H01L 33/62
257/99

FOREIGN PATENT DOCUMENTS

| CN | 101828275 A | 9/2010 |
|---|---|---|
| CN | 201741718 U | 2/2011 |
| CN | 201985093 U | 9/2011 |
| CN | 102610737 A | 7/2012 |
| CN | 202839739 U | 3/2013 |
| CN | 203150615 U | 8/2013 |
| CN | 203521475 U | 4/2014 |
| JP | 2011076919 A | 4/2011 |

OTHER PUBLICATIONS

ISA State Intellectual Property Office of the People's Republic of China, International Search Report and Written Opinion Issued in International Application No. PCT/CN2014/083856, Nov. 26, 2014, WIPO, 9 pages.

* cited by examiner

*Primary Examiner* — William Harriston
(74) *Attorney, Agent, or Firm* — Alleman Hall McCoy Russell & Tuttle LLP

(57) ABSTRACT

A floating heat sink support with copper sheets for a LED flip chip package may include at least two copper sheets and a flexible polymer for fixing the copper sheets, where the copper sheets separated from each other, and where each of the copper sheets is electrically connected with a positive or negative pole of a LED flip chip. Further, a LED package assembly may comprise the floating heat sink support mentioned above and one or more LED chips welded in a flip chip manner on the floating heat sink support. A number of copper sheets in the floating heat sink support are heated separately and expand separately to avoid breakage of a chip substrate resulting from the thermal expansion of a whole bulk of copper sheet, thereby improving the reliability of the LED package structure and prolonging the service life of a LED light source.

8 Claims, 2 Drawing Sheets

FLOATING HEAT SINK SUPPORT WITH COPPER SHEETS AND LED PACKAGE ASSEMBLY FOR LED FLIP CHIP PACKAGE

CROSS REFERENCE TO RELATED APPLICATIONS

The present application is a U.S. National Phase of International Patent Application Serial No. PCT/CN2014/083856, entitled "FLOATING HEAT SINK SUPPORT WITH COPPER SHEETS AND LED PACKAGE ASSEMBLY FOR LED FLIP CHIP PACKAGE," filed on Aug. 7, 2014, which claims priority to Chinese Patent Application No. 201320552457.4, entitled "FLOATING HEAT SINK SUPPORT WITH COPPER SHEETS AND LED PACKAGE ASSEMBLY FOR LED FLIP CHIP PACKAGE," filed on Sep. 6, 2013, the entire contents of each of which are hereby incorporated by reference for all purposes.

TECHNICAL FIELD

The utility relates to heat sink support for LED package, and more particularly to floating heat sink support with copper sheets and corresponding LED package assembly for LED Flip Chip package.

BACKGROUND

Light emitting diode (LED) is a semiconductor device which converts electrical energy into light energy. LED has taken an increasingly important place in the lighting area due to its advantages of high luminous efficacy, low power consumption, low radiation, etc. compared with traditional light sources. However, a LED light source generates a large mount of heat while generating light, and the accumulation of heat may significantly affect the service life of the LED light source. For example, when a LED chip is powered and glows, only about 30% of electric energy is converted into light which is radiated out, and most of electric energy is converted into heat energy and make the LED chip working in a high temperature environment. The optimal operating temperature of a LED chip is around 80 degree C. The operating life of the LED chip and the electric to light conversion efficiency will be reduced significantly when working in high temperature, e.g. 100 degree C. or higher temperature. As such, more electric energy is converted into the residual heat energy, resulting in a deteriorated cycle of the unceasing reduction of the electric to light conversion efficiency.

The current practice of conducting the heat, which is generated by the LED, away from the LED chip is fixing the chip on a substrate using conductive adhesive or non-conductive adhesive materials, and then connect the LED terminals by gold wire bonding to the electrical circuit wiring on the substrates. The heat generated by the chip is dissipated through the heat conductive substrate and it is acted as a heat transfer medium. Since copper is a good heat conductor. Cooper is a heat transfer material that is most commonly used for making the lead frames for high power LED chips. The China utility model patent CN201985093U disclosed a LED copper support with a number of LED chips mounted on its upper portion, the Chinese utility model patent CN202839739 disclosed a high power LED packaging structure comprising a copper substrate for fixing, conducting heat and reflecting light for a LED chip, and the Chinese utility model patent CN203150615U disclosed a LED light source module with high cooling efficiency comprising columnar LED heat sink copper columns.

All of above prior arts relate to achieving the heat radiation of LED chips using copper materials. However, the coefficient of thermal expansion (CTE) of copper is about 19, and the CTE of sapphire substrate frequently used by LED chips is about 5, the difference between which is large. When a high current applies to a LED chip and temperature raise occurs, the heat which is generated by the LED chip transfers onto the copper lead frame, leading to a rapid expansion of the copper, and the sapphire substrate on the chip may be easily broken due to the different expansion of the LED chip and the copper substrate.

Therefore, it is desirable for a novel structure designed for cooling LED chips to avoid the phenomenon of break of a chip substrate.

SUMMARY OF THE UTILITY

In light of above issues, the purpose of this utility is to design a floating heat sink support with copper sheets to avoid break of a chip substrate resulting from the expansion of the copper when it is heated, so as to improve the reliability of a LED package the structure and prolong the service life of LED light sources.

The utility provides a floating heat radiation support with copper sheets for LED flip chip package, which comprises at least two copper sheets and a flexible polymer for fixing the copper sheets, wherein the copper sheets are separated from each other and each of the copper sheets is electrically connected to the positive or negative pole of one LED flip chip.

In a further example, the copper sheets are fixed, connected and separated by the polymer to form a power supply network.

In a further example, the polymer is embedded within grooves on the side surfaces of the copper sheets.

In a further example, the copper sheets are disposed in the concaves of the polymers.

In a further example, the at least two copper sheets are 2 to 11 pieces of copper sheet.

In a further example, the thickness of the copper sheets is between 0.1 mm to 50 mm.

In a further example, the polymer is plastic material.

The invention also provides a LED package assembly comprising: the floating heat sink support with copper sheets as described in above embodiments; and one or more LED chips welded in a flip chip manner on the floating heat radiation copper support.

In a further example, the positive and negative poles of the LED chip are welded on different copper sheets.

For the cooling demand of LED chips from 0.5 W to 3 W, the invention employs flip chip package technology and uses a number of copper sheets connected together by the polymer as heat transfer medium to conduct the heat energy to a radiator, wherein each copper sheet is only welded to the positive pole or negative pole of one chip. When the chip is powered and generates heat, each copper sheet is heated separately and expands separately, and such heat expansion is mitigated by polymer connector so as to avoid the problem of the break of the chip substrate, improve the reliability of the structure of LED packages, and prolong the service life of LED light sources.

DETAILED DESCRIPTION OF THE UTILITY

The implementations of the invention will be described in detail with drawings to illustrate the purposes, technical solutions and advantages of the utility more clearly.

Figure 1:
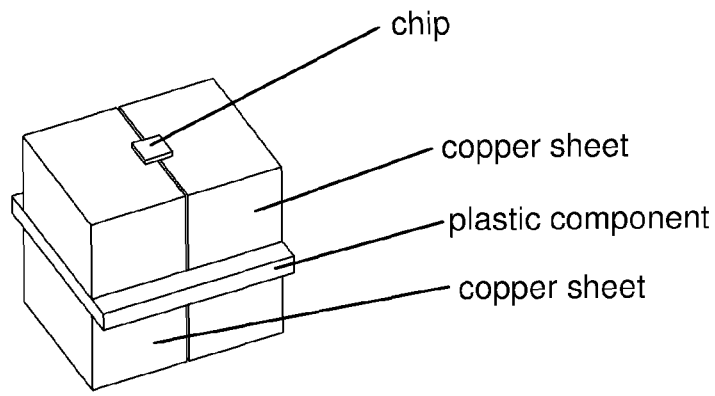
FIG. 1 is a perspective schematic of a heat sink support in according to a first embodiment of the utility.

Referring firstly to FIG. 1, a perspective schematic of a heat sink support according to a first embodiment of the utility is shown. The heat sink support may function as the support of LED chips with a power of 0.3 W to 5 W, which comprises two copper sheets and flexible polymer such as a plastic component formed by plastic material for fixing the two copper sheets together, wherein the two copper sheets are separated by the polymer or other insulating flexible materials. A LED chip is fixed on the copper sheets in a flip chip welding manner such that each of the copper sheets is connected to the positive or negative pole of the chip, respectively. When the chip is powered, the resulting heat is transferred to the copper sheets. Each of the copper sheets is heated separately and expands separately, and such heat expansion is mitigated by polymer connector so as not to result in the break of the LED chip substrate, thus the reliability of the structure of LED chip package is significantly improved.

Figure 2:
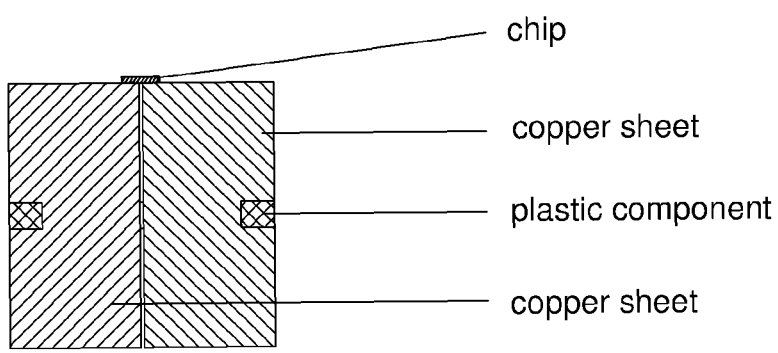
FIG. 2 is a cross-sectional view of the heat sink support shown in FIG. 1.

FIG. 2 shows the cross-sectional view of the heat sink support of FIG. 1. It can be seen that grooves are formed on the left and right side surfaces of the two copper sheets respectively to accommodate the two side edges of the polymer such that the polymer tightly encircles the copper sheets to achieve the steady connection of the copper sheets. Those skilled in the art will appreciate that similar grooves may also be formed on the front and rear faces of the copper sheets such that the polymer is embedded into the copper sheets entirely. In addition, although only two thick copper sheets are illustrated for clarity, it is easily understood that the heat sink support may comprise more than two copper sheets, and the copper sheets may be thicker or thinner. Preferably, the number of the copper sheets may be 2 to 11, and the thickness of the copper sheets may be 0.1 mm to 50 mm. Further, a plurality of copper sheets may also function as an interconnecting circuit of a plurality of chips to implement the different interconnections of the chips.

Figure 3:
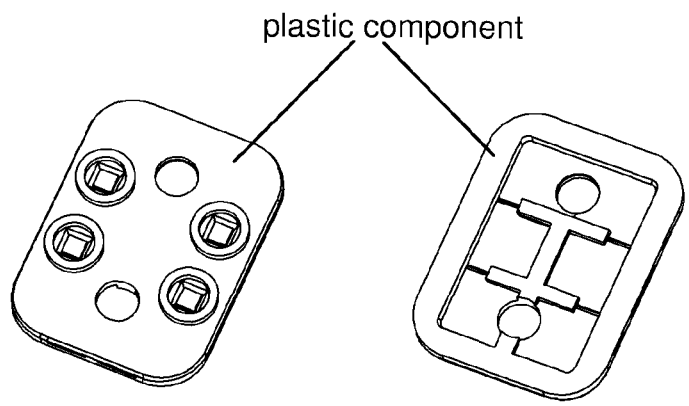
FIG. 3 is an exploded schematic of a heat sink support in according to a second embodiment of the utility.

Next, referring to FIG. 3, an exploded schematic of a heat sink support according to a second embodiment of the utility is shown. The heat sink support comprises two plastic components formed by polymer such as plastic material, and a plurality of circular grooves (four grooves are shown) are formed on the upper surface of the first plastic component, in which a plurality of LED chips may be accordingly disposed. The second plastic component has recesses adapted for accommodating copper sheets with particular shape (such as the copper sheets shown in FIG. 4), and the locations corresponding to the inner gaps of the copper sheets in the recesses protrudes to form flanges. When the copper sheets are placed into the recesses, the flanges are engaged with the gaps in the copper sheets to make the copper sheets steady. Further, the flanges further function to electrically insulate the various portions of the copper sheets, thus divide the copper sheet into five individual small blocks shown in the Figure.

Figure 4:
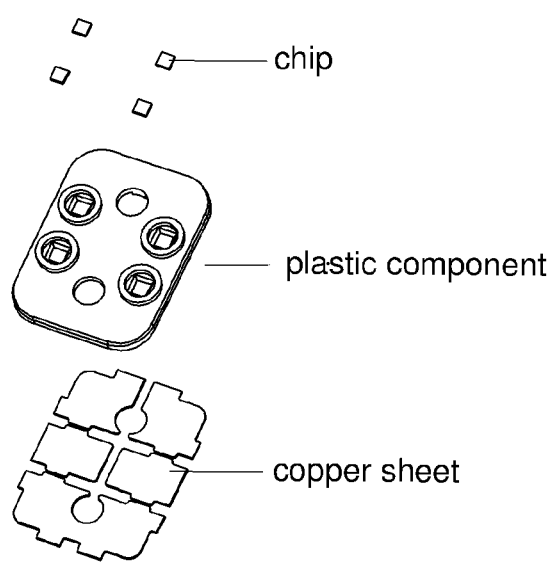
FIG. 4 is an exploded schematic of a LED package using the heat sink support shown in FIG. 3.

FIG. 4 shows an exploded schematic of a LED package using the heat sink support shown in FIG. 3. A plurality of chips and a large copper sheet with specific shape are specifically shown (the plastic components for placing the copper sheets can be seen in FIG. 3). The large copper sheet is divided into five small copper sheets, each of which is electrically isolated from one another. It can be seen that, after assembling the LED chips, the plastic components and the copper sheets to form a LED package, each chip is located above the border of two adjacent small copper sheets such that each of the copper sheets may be connected to the positive or negative pole of the chip to from a power supply network. When the chip is powered, the resulting heat is transferred to the copper sheets, and each of the small copper sheets is heated separately and expands separately. Such heat expansion is mitigated by polymer connector so as not to result in the break of the chip substrate, and the reliability of the structure of LED package will be significantly improved.

It will be appreciated that, although the description of above embodiments takes four chips and five small copper sheets as example, they are not present as limitation. In fact, more or less chips may be disposed and the copper sheet may be divided into more or less sub-regions in accordance with practical requirements. Further, although the grooves on the upper surface of the first plastic component shown in FIGS. 3 and 4 are circular, grooves with other shapes are also contemplated. For example, conical grooves may converge light better so as to reduce the diffuse of the light. Further, a reflective layer may be coated on the inner surface of the grooves to further improve the light utilization.

The above is only description for preferable embodiments of the utility rather than limitations made to the utility in any other forms. Any modifications and equivalent variations made on the basis of the substantial technology of the invention still fall in the claimed scope of the utility.

The invention claimed is:

1. A floating heat sink support with copper sheets for LED flip chip package, comprising:
    at least two copper sheets; and
    a flexible polymer embedded in grooves on side surfaces of the copper sheets;
    wherein each two adjacent copper sheets are separated from each other to form a gap above which a LED flip chip is arranged across two adjacent copper sheets, and each of the copper sheets is electrically connected with a positive or negative pole of the LED flip chip.

2. The floating heat sink support with copper sheets of claim 1, wherein the copper sheets are fixedly connected by the polymer and are divided to form a power supply network.

3. A floating heat sink support with copper sheets for LED flip chip package, comprising:
    at least two copper sheets; and
    a flexible polymer for fixing the copper sheets;
    wherein each two adjacent copper sheets are separated from each other to form a gap above which a LED flip chip is arranged across two adjacent copper sheets, and each of the copper sheets is electrically connected with a positive or negative pole of the LED flip chip, and wherein the copper sheets are disposed within recesses of the polymer.

4. The floating heat sink support with copper sheets of claim 1, wherein the at least two copper sheets are 2 to 11 pieces of copper sheets.

5. The floating heat sink support with copper sheets of claim 1, wherein a thickness of the copper sheets is ranged from 0.1 mm to 50 mm.

6. A LED package assembly, comprising:
    a floating heat sink support comprising at least two copper sheets and a flexible polymer embedded in grooves on side surfaces of the copper sheets; and
    one or more LED chips welded in a flip chip manner on the floating heat sink support with copper sheets, each LED chip arranged across two adjacent copper sheets, the two adjacent copper sheets separated from each other to form a gap above which the LED chip is arranged, wherein each of the copper sheets is electrically connected with a positive or negative pole of the LED chip.

7. The LED package assembly of claim 6, wherein the positive and negative poles of the LED chips are welded to different copper sheets, respectively.

8. The floating heat sink support with copper sheets of claim 1, wherein the flexible polymer is a non-electrical conducting flexible polymer, and wherein the flexible polymer tightly encircles the copper sheets to achieve a steady connection of the copper sheets.

* * * * *